(12) United States Patent
Goller et al.

(10) Patent No.: US 7,569,938 B2
(45) Date of Patent: Aug. 4, 2009

(54) INTERCONNECTIONS FOR INTEGRATED CIRCUITS

(75) Inventors: Klaus Goller, Regensburg (DE); Roland Wenzel, Maulbrunn (DE)

(73) Assignee: Infineon Technologies AG, Munich (DE)

( * ) Notice: Subject to any disclaimer, the term of this patent is extended or adjusted under 35 U.S.C. 154(b) by 364 days.

(21) Appl. No.: 11/387,488

(22) Filed: Mar. 23, 2006

(65) Prior Publication Data

US 2006/0163737 A1 Jul. 27, 2006

Related U.S. Application Data

(63) Continuation of application No. PCT/EP2004/052093, filed on Sep. 8, 2004.

(30) Foreign Application Priority Data

Sep. 25, 2003 (DE) ................ 103 44 605

(51) Int. Cl.
*H01L 29/40* (2006.01)

(52) U.S. Cl. .............. 257/773; 257/734; 257/786

(58) Field of Classification Search ............. 257/773, 257/734, 786, 776, 758
See application file for complete search history.

(56) References Cited

U.S. PATENT DOCUMENTS

| 5,955,788 | A | 9/1999 | Iwasa |
| 5,963,831 | A | 10/1999 | Fu |
| 6,548,902 | B2 | 4/2003 | Suzuki et al. |
| 2002/0127846 | A1 | 9/2002 | Burrell et al. |

FOREIGN PATENT DOCUMENTS

| EP | 0 845 808 A2 | 6/1998 |
| EP | 1 220 315 A2 | 3/2002 |
| JP | 60201648 | 10/1985 |

*Primary Examiner*—Stacy A Whitmore
(74) *Attorney, Agent, or Firm*—Brinks Hofer Gilson & Lione

(57) ABSTRACT

An interconnect connection structure having first and second interconnects and multiple connection elements that electrically connect the first interconnect to the second interconnect is described. The multiple connection elements are formed laterally in a lateral region of the first and second interconnects relative to an overlay orientation of the interconnects. A central region may be free of connection elements so that electro-migration properties of the connection structure are improved and the current-carrying capacity is increased.

11 Claims, 3 Drawing Sheets

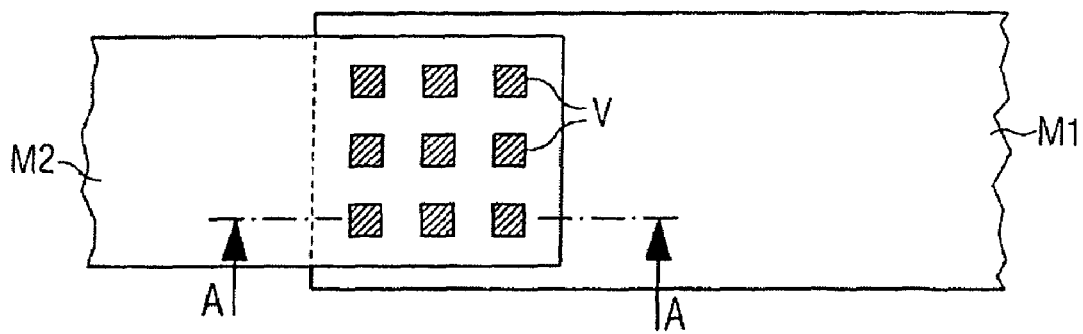
FIG 1  Prior art
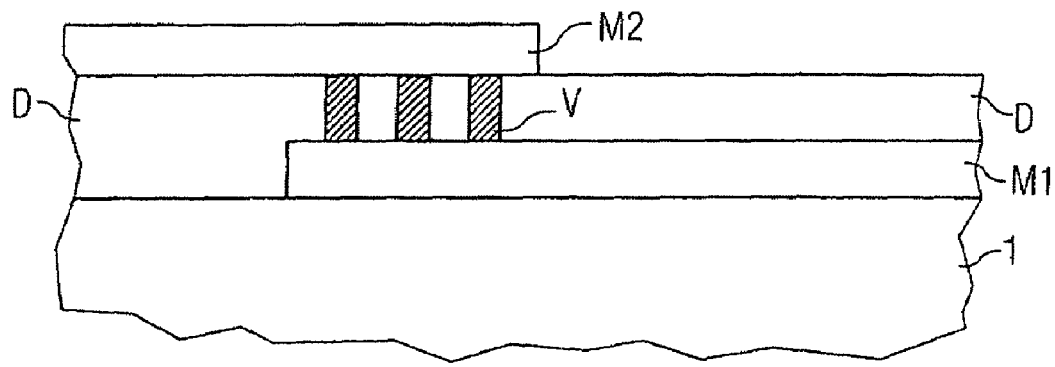
FIG 2  Prior art    A-A
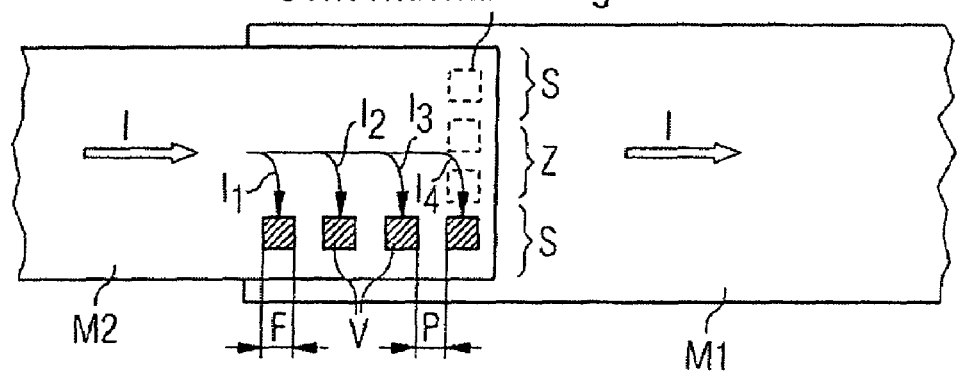
FIG 3    Conventional arrangement

INTERCONNECTIONS FOR INTEGRATED CIRCUITS

PRIORITY AND CROSS REFERENCE TO RELATED APPLICATION

This application is a continuation of International Application No. PCT/EP2004/052093, filed Sep. 8, 2004, which claims priority to German application 103 44 605.2, filed Sep. 25, 2003, both of which are incorporated in their entirety by reference herein.

BACKGROUND OF THE INVENTION

1. Field of the Invention

The invention relates to interconnects, and in particular to interconnects that for improve electro-migration properties in integrated circuits.

2. Description of the Related Art

Integrated circuits may include multiple semiconductor components such as, field effect transistors (FET's) or bipolar transistors (BPT's), that are driven by means of interconnects or interconnect structures. In large scale integrated circuits, multiple interconnect planes, or metallization planes, may be provided. The interconnect planes are isolated from one another by insulating layers. The interconnect planes are connected to one another by electrically conductive connection elements, also referred to as "vias". The connection elements may be arranged in a grid perpendicular to the interconnects.

FIG. 1 shows a conventional interconnect connection structure where a first interconnect M1, or first metallization layer, is connected to an overlying second interconnect by an array of nine connection elements or vias V. FIG. 2 shows a sectional view A-A of the interconnect connection structure of FIG. 1. The first interconnect M1 is situated on a carrier layer 1, such as a substrate, and is correspondingly patterned. An insulation layer D is formed on a surface of the first interconnect M1 and the carrier layer 1. Contact holes to the first interconnect M1 are formed in the insulation layer D, and electrically conductive material is subsequently filled in to realize the connection elements or contact vias V. A second interconnect, or second metallization layer M2, is situated on the surface of the insulation layer D and the connection elements V, and is electrically connected to the first interconnect M1 by means of the connection elements V.

Interconnect structures allow a current flow through the interconnect structure. A maximum possible current density, (i.e., current per interconnect cross section), in accordance with Black's law, is directly proportional to the lifetime of the structure. The maximum current density and lifetime may be determined during a technology qualification or testing. In a product design, any section or part of a metallization or an interconnect has a maximum current density that is not to be exceeded permitted.

An interconnect connection structure may constitute a weak point in interconnect structures due to a barrier function with regard to a material transport, such as electro-migration phenomena. Wider interconnects may be used, taking up additional area in a product or circuit layout. Where technology does not support current density design needs, the product or the semiconductor component may not be produced.

Electro-migration properties may be improved to make a current uniform over an interconnect width, by introducing slots filled with a dielectric and having different lengths into the interconnects. However, such connection structures are very complex and costly.

Therefore, there is a need for a cost-effective interconnect connection that realizes improved electro-migration properties, and thus, increased current-carrying capacities of the interconnects.

SUMMARY OF THE INVENTION

The present invention includes an interconnect connection structure, an associated method of production for increasing current-carrying capacities of interconnects. An electro-migration property of interconnects may be improved with multiple connection elements that are formed laterally in at least one lateral region of a first and second interconnect relative to an overlay orientation of the overlaid interconnects, where a central region is free of the connection elements. Thus, the current-carrying capacity of the interconnects in this region may be significantly increased. In this way, it is possible to further improve integration densities and/or a lifetime of an integrated semiconductor circuit.

The connection elements may be arranged in a predetermined layout grid. The connection elements may have a predetermined structure width, and predetermined structure spacing. Existing interconnect connection structures may have improved electro-migration properties and increased current-carrying capacities with minimal modifications, or by omitting contact openings in predetermined zones of an overlay region. A width of the central region that is free of connection elements is greater than a width of the at least one lateral region having the connection elements.

The connection elements may be connected to interconnects overlaid on one another and arranged in parallel where one interconnect is positioned above the other. The connection elements may be connected to interconnects arranged perpendicular to each another where (e.g., rotated through 90° about an axis which is perpendicular to the surfaces of the interconnects). In an embodiment, the interconnects have essentially identical interconnect widths. Thus, existing wiring layouts or mask sets may incorporate the interconnects, resulting in significant cost savings.

The connection elements may have a different material from the interconnects. In an embodiment, tungsten or copper may be used for the interconnects. The connection elements are preferably a tungsten material.

The connection elements and the interconnects may each or both have a diffusion barrier layer. Therefore, a diffusion of impurities from upper interconnect planes into a semiconductor substrate may be minimized or prevented, and the electrical properties of the semiconductor components improved.

In a method for producing an interconnect connection structure, a first interconnect is formed on a carrier layer. An insulation layer is formed on the first interconnect, and multiple electrically conductive connection elements are formed in the insulation layer so that they make contact with the first interconnect. A second interconnect is formed on the insulation layer so that the connection elements formed therein make contact with the second interconnect. The multiple connection elements are arranged so that they lie laterally in at least one lateral region of the first and second interconnects relative to an overlay orientation of the overlaid interconnects. A central region is defined free of connection elements. The method may be applied to existing methods for interconnecting connection structures.

DESCRIPTION OF THE DRAWINGS

Exemplary embodiments of the invention are explained below with reference to the accompanying drawings. Identi- FIG. 1 shows a plan view of a prior art interconnect connection structure.

FIG. 2 shows a sectional view of the prior art interconnect connection structure of FIG. 1 along section A-A.

FIG. 3 shows a plan view of an exemplary interconnect connection structure in accordance with present the invention.

DESCRIPTION OF THE PREFERRED EMBODIMENTS

FIG. 3 shows a simplified plan view of an exemplary interconnect connection structure. As shown in FIG. 3, a first interconnect M1 is formed on a carrier layer 1, such as a semiconductor substrate. Semiconductor components may be formed with the semiconductor substrate. The first interconnect M1 may be an electrically conductive layer such as a metal layer adjacent the carrier layer. Multiple connection elements V are formed in an overlying insulation layer, or dielectric layer D, The multiple connection elements V are in electrical contact with the first interconnect M1. The multiple connection elements may also be referred to as contact "vias." A second interconnect M2 is arranged on or adjacent the surface of the dielectric layer, or insulation layer D. The second interconnect M2 may be an electrically conductive layer, such as a metal layer adjacent to the insulation layer. The second interconnect M2 is in electrical contact with the connection elements. For example, the second interconnect M2 is in electrical contact with a top side of the connection elements in the dielectric layer. As a result, an interconnect connection structure is realized.

As shown in FIG. 3, the connection elements V are arranged parallel along a length of one or both of the interconnects M1 and M2. The connection elements V may be oriented along a length of the interconnect orientations in a lateral region of the first and second interconnects M1 and M2. An overlay region S of the interconnects M1 and M2 may include a region in which the interconnects lie one above another. In at least a portion of an overlay region S, the multiple connection elements V are arranged laterally relative to an overlay orientation I of the interconnects, such as a resulting orientation of the overlaid interconnects. A central region Z of the overlaid interconnects M1 and M2 is free of connection elements V.

Figure 8:
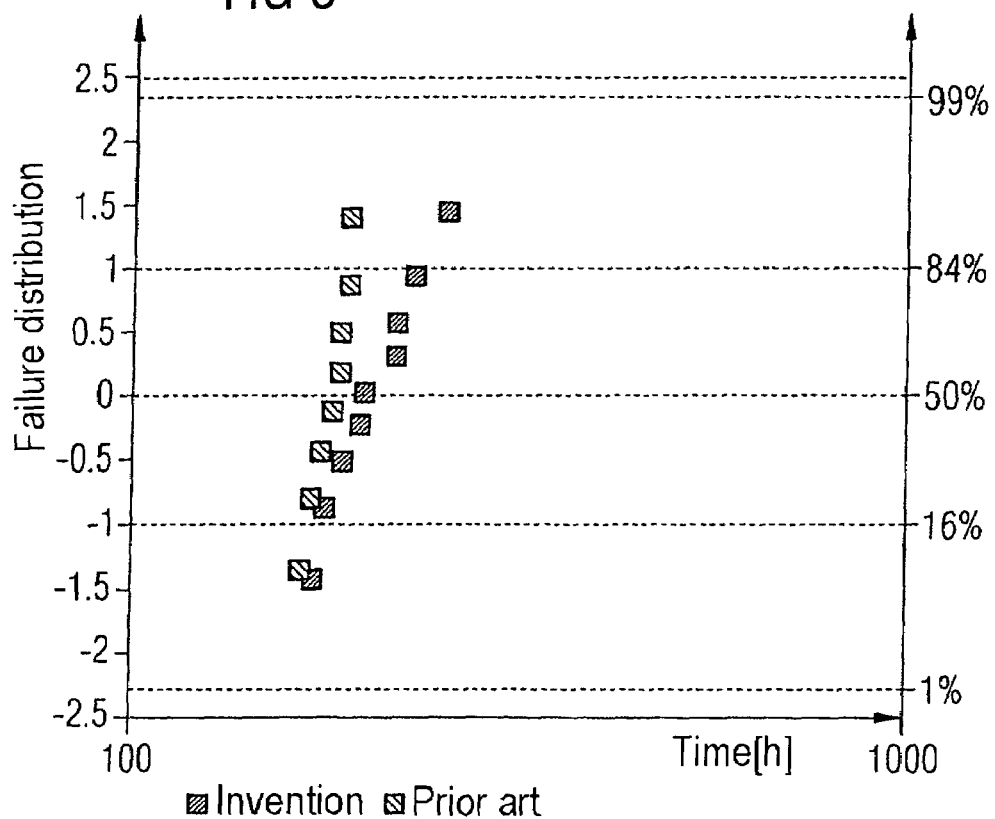
FIG. 8 shows a graphical representation for illustrating a failure distribution in accordance with a conventional interconnect connection structure and an interconnect connection structure according to the invention.

FIG. 8 illustrates a plot of failure distribution comparison of an embodiment of the present invention and prior art connection structures. As shown in FIG. 8, given the same or a smaller number of connection elements V, by "folding over" the usually column-wise arrangement of the connection elements V with respect to the interconnect length into a row-wise arrangement—lying in a lateral region S—of the connection elements V with respect to the interconnect length, it is possible to improve the electro-migration properties over the prior art and a current-carrying capacity of the interconnects or of the entire interconnect structure is increased. Integration densities may be increases and the lifetime of integrated circuits improved.

An overlaid orientation I of the interconnects M1 and M2 refers to a resulting orientation of the overlaid interconnects M1 and M2. The overlay orientation I essentially matches a main current direction in the interconnects M1 and M2 in an operating state. An overlay orientation, or a main current direction I, of the interconnects M1 and M2 may be considered a direction of their interconnect length, where only in a connection region is this main current divided into multiple of individual currents I1 to I4 which flow to the laterally arranged connection elements V and also through the latter to the lower first interconnect M1, where they continue to flow again in the direction of the interconnect length or main current or overlaid orientation I.

When the connection elements V are rotated according to the invention from an end region of the interconnects into only one lateral region S, as shown in FIG. 3, the current-carrying capacity rises for example to 1½-fold. The lifetime of the interconnect may be doubled. Furthermore, this new arrangement of the contact vias or connection elements V does not take up more area or space. Accordingly, the integration densities may be increased given the same current-carrying capacity.

The connection elements V are preferably in a predetermined layout grid. For example, the connection elements V may have a predetermined structure width F and a predetermined structure spacing P (space P; pitch=F+P). The predetermined layout grid may be applied to an array in already existing databases or layout lists, by omitting connection elements V in a central region Z (i.e., the 9 vias illustrated in FIG. 1 are reduced to 6). No extra costs or complicated redesigns may arise in while providing a significant improvement of the electro-migration properties. Preferably, a width of the central region Z that is free of the connection elements V is greater than a width of the lateral regions S of the interconnects M1 and M2.

The connection elements V and the interconnects M1 and M2 may have an identical electrically conductive material. The connection elements V may have a different materials for one or both of the interconnects M1 and M2. When the connections elements have a different material from one or both of the interconnects M1 and M2, further improved interconnect structures can be created. The interconnects M1 and M2 may be an aluminum or copper, while the connection elements or electrically conductive vias V are a tungsten or a tungsten filling layer. In order to improve the electro-migration properties of the interconnect structure, multilayer sequences are also conceivable for the interconnects M1 and M2 and for the connection elements V. A diffusion barrier layer, or a so-called liner, may be used to prevent dopants from penetrating into a semiconductor substrate. Such a diffusion barrier layer (not illustrated) may be formed either on the surface of the first interconnect M1 in the bottom region of the connection elements V, in the top region of the connection elements V or before the formation of the second interconnect M2, that is to say on the surface of the connection elements and the insulation layer D.

Figure 4:
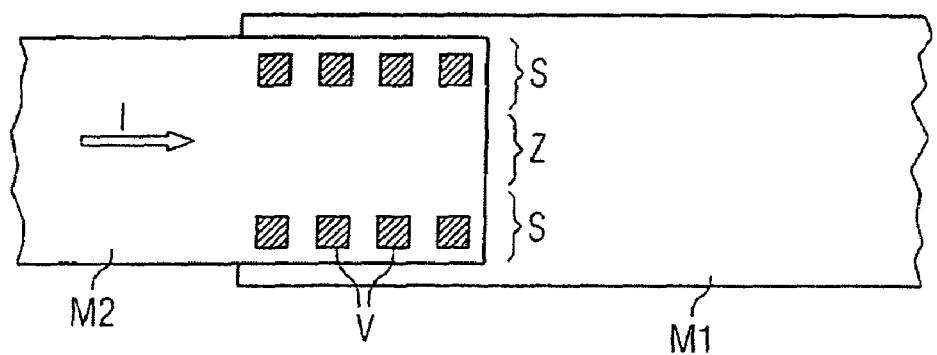
FIG. 4 shows a plan view of another exemplary interconnect connection structure.

FIG. 4 shows a simplified plan view of an interconnect connection structure in accordance with a second exemplary embodiment. As shown in FIG. 4, the multiple connection elements V may be formed in multiple lateral regions S of the interconnects M1 and M2. In a via matrix of connection elements V, or a connection element V array, for example a 4×4 array or matrix, two connection element rows in the central region Z of the interconnects M1 and M2 may be eliminated as shown in FIG. 4. As shown in FIGS. 3 and 4, the interconnects M1 and M2 are arranged essentially parallel one above another where each interconnect M1 and M2 may have a substantially similar width. The interconnects M1 and M2 may also have different interconnect widths and the interconnects may be arranged perpendicular to one another.

Figure 5:
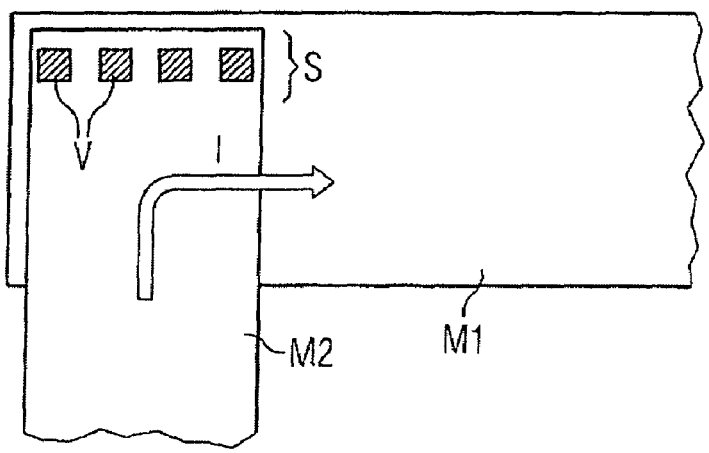
FIG. 5 shows a plan view of another exemplary interconnect connection structure.

FIG. 5 shows a simplified plan view of an interconnect connection structure in accordance with another exemplary embodiment where the interconnects M1 and M2 are arranged perpendicular to one another with regard to their interconnect length or their associated interconnect orientations. The surfaces of the interconnects are oriented substantially parallel to one another. Thus a curved or angled overlay orientation, or main current direction I, for the overlaid interconnects M1 and M2 is formed in the overlay region. The connection elements V are formed laterally in at least one of the lateral regions S of the first and second interconnects M1 and M2 relative to the overlay orientation I (from M2 via V to M1), which essentially corresponds to the main current direction through the two interconnects, and a central region is free of connection elements V. The contact vias V may be arranged in an outer partial lateral region of the interconnects, where the contact vias are located in a lateral region with regard to the first interconnect M1 and in an end region with regard to the second interconnect M2.

Figure 6:
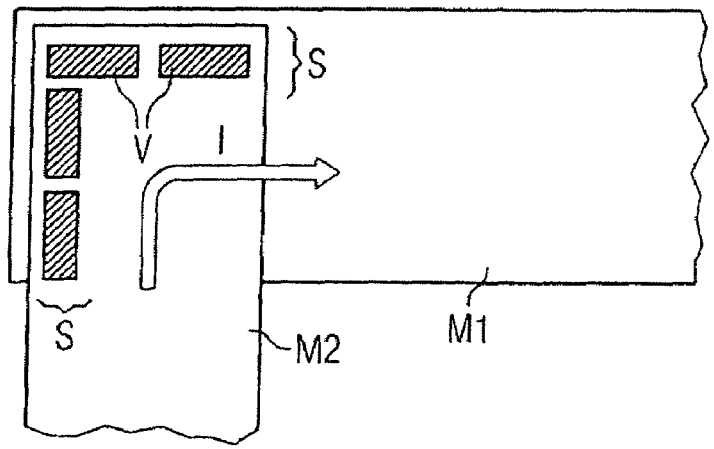
FIG. 6 shows a plan view of another exemplary interconnect connection structure.

FIG. 6 shows a simplified plan view of an interconnect connection structure in accordance with another exemplary embodiment where the connection elements V are formed in the outer lateral region of the interconnects, or the lateral and end regions of the first and second interconnects M1 and M2, laterally alongside the overlay orientation, or the main current direction I. The connection elements may have an elongated hole form in the overlay orientation.

Figure 7:
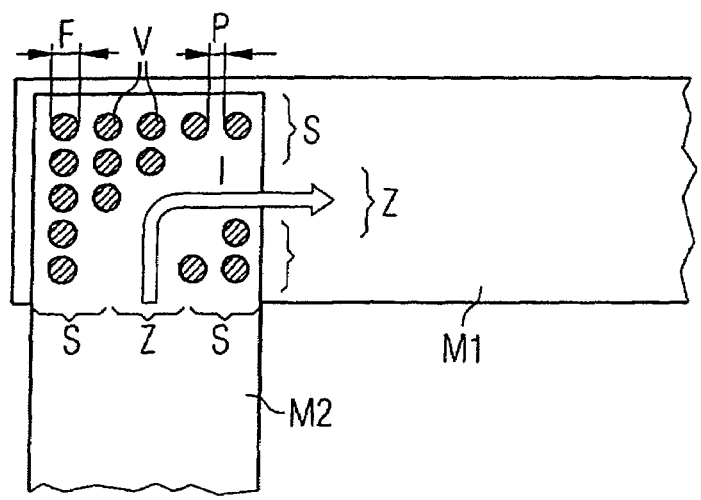
FIG. 7 shows a plan view of another exemplary interconnect connection structure.

FIG. 7 shows a simplified plan view of an interconnect connection structure in accordance with another exemplary embodiment where the connection elements V are formed not only in an outer lateral region S laterally with respect to the overlay orientation or the main current direction I, but also in an inner lateral region S. Furthermore, the connection elements or contact vias V may also have a circular form or circular cross-section. The form or cross-section of the connection elements V may be any current or later developed forms or cross-sections for contact vias. For example, the form of the contact vias V may be oval, square, rectangular, elliptical, or other form for the connection elements V.

FIG. 8 shows a simplified graphical representation or plot for a failure distribution of an interconnect connection structure having eight connection elements as a function of a time duration. The interconnect connection structures are arranged on the one hand in accordance with the prior art in a column transversely with respect to the interconnect length on the end area of the interconnects, and on the other hand in accordance with FIG. 3 in only one lateral region S of the interconnects in a row longitudinally with respect to the interconnect length. An increased lifetime thus results for approximately the same failure probability.

The invention has been described above on the basis of an interconnect connection structure such as is used in integrated semiconductor circuits. However, it is not restricted thereto and can be used in the same way in particular also for wiring structures in printed circuits (PCB, Printed Circuit Boards) or On-Chip Wirings.

The invention claimed is:

1. An interconnect connection structure, comprising:
   a first interconnect formed in a first interconnect plane;
   a second interconnect formed in a second interconnect plane, the second interconnect overlaying at least a potion of the first interconnect in an overlaying region;
   a plurality of connection elements electrically connecting the first interconnect to the second interconnect in at least one lateral region of the overlaying region;
   wherein the first and second interconnects are arranged perpendicularly to one another; and
   the plurality of connection elements are formed laterally in relation to a curved overlay orientation in at least the one lateral region of the first and second interconnects, whereas a central region is free of connection elements in the entire overlay section.

2. The interconnect structure of claim 1, where the plurality of connection elements are arranged in a predetermined layout grid having a predetermined structure width and a predetermined structure spacing.

3. The interconnect connection structure of claim 2, where the first and second interconnects arc arranged substantially perpendicular, surfaces of the first and second interconnects being oriented parallel, and having a substantially identical interconnect width.

4. The interconnect connection structure of claim 2, where the first and second interconnects are arranged substantially parallel, the surfaces of the first and second interconnects being oriented parallel, and have a substantially identical interconnect width.

5. The interconnect connection structure of claim 2, where the plurality of connection elements each have anyone of a rectangular, circular, oval, elliptical or elongated hole cross-section.

6. The interconnect connection structure of claim 2, where the each of plurality of connection elements comprise a material being substantially different than a material for the first and second interconnects.

7. The interconnect connection structure of claim 2, where the plurality of connection elements comprises a diffusion barrier layer.

8. The interconnect connection structure of claim 2 where the first and second interconnects comprises a diffusion layer.

9. A semiconductor device, comprising
   at least two substantially parallel, electrically-conductive interconnect layers being separated along an axis perpendicular to the two interconnect layers, the at least two interconnect layers at least partially overlapping each other in an intersection region;
   a dielectric layer arranged between the at least two interconnect layers in the intersection region;
   a plurality of electrically conductive vias aligned in the dielectric layer in a portion of the intersection region being laterally offset from a central region and parallel to a current flow in at least one of the interconnect layers, the central region being substantially free of vias;
   wherein the first and second interconnects are arranged perpendicularly to one another; and
   the plurality of connection elements are formed laterally in relation to a curved overlay orientation in at least the one lateral region of the first and second interconnects, whereas a central region is free of connection elements in the entire overlay section.

10. The semiconductor device of claim 9, where central region is defined by a width being greater than a width the portion of the dielectric layer in which the vias are aligned laterally offset from a central region.

11. The semiconductor device of claim 9 are arranged substantially perpendicular.

* * * * *

UNITED STATES PATENT AND TRADEMARK OFFICE
CERTIFICATE OF CORRECTION

PATENT NO. : 7,569,938 B2
APPLICATION NO. : 11/387488
DATED : August 4, 2009
INVENTOR(S) : Goller et al.

Page 1 of 1

It is certified that error appears in the above-identified patent and that said Letters Patent is hereby corrected as shown below:

On Title Page:

Item (75), delete "Maulbrunn" and substitute --Maulbronn-- in its place.

Signed and Sealed this

Twenty-seventh Day of October, 2009

David J. Kappos
*Director of the United States Patent and Trademark Office*